United States Patent
Sills

(10) Patent No.: US 8,633,566 B2
(45) Date of Patent: Jan. 21, 2014

(54) MEMORY CELL REPAIR

(75) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 182 days.

(21) Appl. No.: 13/089,967

(22) Filed: Apr. 19, 2011

(65) Prior Publication Data

US 2012/0267600 A1    Oct. 25, 2012

(51) Int. Cl.
*H01L 23/52* (2006.01)

(52) U.S. Cl.
USPC ............ 257/529; 257/E23.149; 257/E27.044; 257/5; 257/364; 257/E27.098; 365/225.7; 438/601

(58) Field of Classification Search
USPC ............ 257/364, 529, E27.098, 5, E23.149, 257/E27.044; 438/601; 365/225.7
See application file for complete search history.

(56) References Cited

U.S. PATENT DOCUMENTS

| | | | |
|---|---|---|---|
| 4,729,116 A | 3/1988 | Sato et al. | |
| 5,608,678 A | 3/1997 | Lysinger | |
| 6,791,855 B2 | 9/2004 | Batson et al. | |
| 7,233,539 B2 * | 6/2007 | Boas et al. | 365/225.7 |
| 7,778,070 B2 | 8/2010 | Nirschl et al. | |
| 2007/0132049 A1 | 6/2007 | Stipe | |
| 2010/0090213 A1 * | 4/2010 | Jeong et al. | 257/42 |
| 2010/0195409 A1 | 8/2010 | Siau | |
| 2010/0271885 A1 | 10/2010 | Scheuerlein et al. | |

* cited by examiner

*Primary Examiner* — Eva Yan Montalvo

(74) *Attorney, Agent, or Firm* — Brooks, Cameron & Huebsch, PLLC

(57) ABSTRACT

A repairable memory cell in accordance with one or more embodiments of the present disclosure includes a storage element positioned between a first and a second electrode, and a repair element positioned between the storage element and at least one of the first electrode and the second electrode.

26 Claims, 3 Drawing Sheets

MEMORY CELL REPAIR

TECHNICAL FIELD

The present disclosure relates generally to the field of semiconductor memory. More particularly, in one or more embodiments the present disclosure relates to memory cell repair.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), flash memory, phase change random access memory (PCRAM), spin torque transfer random access memory (STTRAM), resistive random access memory (RRAM), magnetoresistive random access memory (MRAM; also referred to as magnetic random access memory), conductive-bridging random access memory (CBRAM), among others.

Memory devices are utilized as non-volatile memory for a wide range of electronic applications in need of high memory densities, high reliability, and low power consumption. Non-volatile memory may be used in a personal computer, a portable memory stick, a solid state drive (SSD), a personal digital assistant (PDA), a digital camera, a cellular telephone, a portable music player (e.g., MP3 player), a movie player, and other electronic devices, among others. Program code and system data, such as a basic input/output system (BIOS), are typically stored in non-volatile memory devices.

Many memory devices, such as RRAM, PCRAM, MRAM, STTRAM and CBRAM, for example, can include arrays of memory cells organized in a two-terminal cross-point architecture, for instance. In various instances, such memory cells may fail (e.g., become unusable). As an example, a failed memory cell may create a short between the word line and bit line associated with the cell by becoming stuck in a closed state (e.g., by becoming irreversibly stuck in a low resistance state). The word line-bit line short can prevent the word line and bit line from being driven to different potentials, which can prevent the ability to operate (e.g., program, read, erase, etc.) cells coupled to the particular word line and/or bit line. Furthermore, depending on the operating scheme associated with the memory device, the short can also prevent cells coupled to adjacent word lines and/or bit lines from being operated properly.

Some previous approaches compensate for a failed memory cell by providing redundant word lines and bit lines that can be used to replace the word lines and bits lines made unusable by a failed memory cell. For instance, the addresses of the unusable word lines and bit lines can be mapped to new addresses in redundant memory. However, providing redundant memory capacity has drawbacks such as increasing the die size associated with the memory device and can slow operation of the memory device, among other drawbacks.

DETAILED DESCRIPTION

Figure 1:
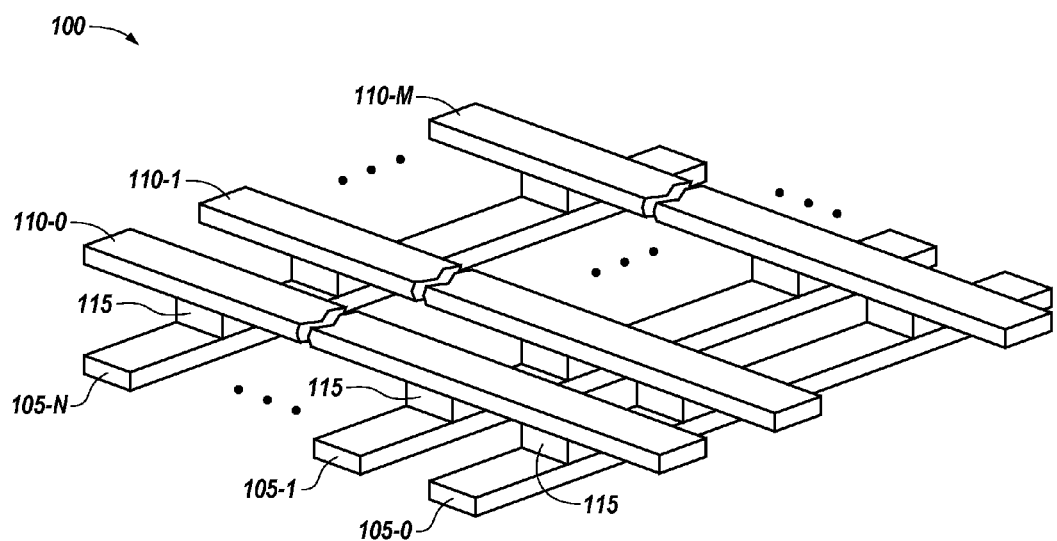
FIG. 1 is a block diagram of a portion of an array of memory cells in accordance with one or more embodiments of the present disclosure.

The present disclosure includes methods, devices, and systems associated with memory cell repair. A repairable memory cell in accordance with one or more embodiments of the present disclosure includes a storage element positioned between a first and a second electrode, and a repair element positioned between the storage element and at least one of the first electrode and the second electrode.

Embodiments of the present disclosure can provide benefits such as reducing the amount of redundant memory cell area associated with compensating for failed bits (e.g., memory cells that are stuck in a state causing a word line-bit line (WL-BL) short), as compared to previous approaches. As such, embodiments can reduce die size as compared to previous approaches, among other benefits.

The figures herein follow a numbering convention in which the first digit or digits correspond to the drawing figure number and the remaining digits identify an element or component in the drawing. Similar elements or components between different figures may be identified by the use of similar digits. For example, 242 may reference element "42" in FIG. 2A, and a similar element may be referenced as 342 in FIG. 3, etc.

FIG. 1 is a block diagram of a portion of an array 100 of memory cells 115 in accordance with one or more embodiments of the present disclosure. In the example illustrated in FIG. 1, the array 100 is a cross point array 100 including a first number of conductive lines 105-0, 105-1, . . . , 105-N (e.g., access lines, which may be referred to herein as word lines) and a second number of conductive lines 110-0, 110-1, . . . , 110-M (e.g., data lines, which may be referred to herein as bit lines). As illustrated, the word lines 105-0, 105-1, . . . , 105-N are substantially parallel to each other and are substantially orthogonal to the bit lines 110-0, 110-1, . . . , 110-M, which are substantially parallel to each other; however, embodiments are not so limited.

The memory cells 115 of array 100 can be memory cells such as those described in connection with FIGS. 2A, 2B, and 3. In this example, a memory cell 115 is located at each of the intersections of the word lines 105-0, 105-1, . . . , 105-N and bit lines 110-0, 110-1, . . . , 110-M and the memory cells 115 can function in a two-terminal architecture (e.g., with a particular word line 105-0, 105-1, . . . , 105-N and bit line 110-0, 110-1, . . . , 110-M serving as a bottom and top electrode).

The memory cells 115 can be RRAM cells, CBRAM cells, PCRAM cells, and/or STT-RAM cells, among other types of memory cells. As described further below, the memory cells 115 can include a repair element coupled to a storage element. In various embodiments, the memory cells 115 can have a "stack" structure that includes a select device (e.g., an access device such as a diode) coupled to the storage element and/or the repair element.

A storage element can include a programmable portion of the memory cell 115 (e.g., the portion programmable to a number of different data states). For instance, in resistive memory cells, a storage element can include the portion of the memory cell having a resistance that is programmable to particular levels corresponding to particular data states responsive to applied programming voltage and/or current pulses, for instance. A storage element can include, for instance, one or more resistance variable materials such as a transition metal oxide material or a perovskite including two or more metals (e.g., transition metals, alkaline earth metals, and/or rare earth metals). Embodiments are not limited to a particular resistive variable material or materials associated with the storage elements of the memory cells 115. For instance, the resistive variable material can be a chalcogenide formed of various doped or undoped materials. Other examples of resistive variable materials that can be used to form storage elements include binary metal oxide materials, colossal magnetoresistive materials, and/or various polymer based resistive variable materials, among others.

As described further below, a repair element refers to a portion of a memory cell that changes from a conductive state to a nonconductive state responsive to a threshold current density. A repair element can be a fuse element or a conductive bridge filament, in one or more embodiments.

In operation, the memory cells 115 of array 100 can be programmed by applying a voltage (e.g., a write voltage) across the memory cells 115 via selected word lines 105-0, 105-1, ..., 105-N and bit lines 110-0, 110-1, ..., 110-M. The width and/or magnitude of the voltage pulses across the memory cells 115 can be adjusted (e.g., varied) in order to program the memory cells 115 to particular data states (e.g., by adjusting a resistance level of the storage element).

A sensing (e.g., read) operation can be used to determine the data state of a memory cell 115 by sensing current, for example, on a bit line 110-0, 110-1, ..., 110-M corresponding to the respective memory cell 115 responsive to a particular voltage applied to the selected word line 105-0, 105-1, ..., 105-N to which the respective cell 115 is coupled. Sensing operations can also include biasing unselected word lines and bit lines at particular voltages in order to sense the data state of a selected cell 115.

For various reasons, such as wear due to program/read cycling, a cell may become irreversibly stuck in a resistance state that can render the cell and/or cells around it unusable. For instance, the storage element of a cell can fail by becoming stuck (e.g., permanently) in a low resistance state, which can result in a short between the word line and the bit line associated with the cell. As a result of the short, the particular word line and bit line cannot be driven to different potentials. Therefore, the failed cell, as well as the other cells coupled to the associated word line (e.g., row) and bit line (e.g., column), become unusable. In some instances, the unusable row and/or column can be replaced with a row and/or column from a redundant array (e.g., via a mapping function executed by a controller coupled to the array). However, depending on the scheme used to operate the memory array, a short caused by a failed cell may require multiple redundant rows and/or columns to compensate for the failed cell. The use of redundant rows and columns to compensate for failed cells has drawbacks such as increasing die-size, for example.

In one or more embodiments of the present disclosure, a repair element associated with a memory cell 115 can be used to accommodate for a failed memory cell (e.g., a memory cell having a storage element stuck in a closed state). As used herein, a closed state refers to a resistance level sufficiently low that a bit line and word line associated with the cell cannot be biased at different potentials. In various embodiments, a repair element in series with the storage element of a memory cell is configured to transition from a conductive state to a nonconductive (e.g., high resistance) state when the storage element of the cell becomes stuck in a closed state. As such, the transition of the repair element to the nonconductive state alleviates the short between the word line and bit line, such that the use of one or more redundant rows and/or columns is avoided.

In various embodiments, the repair element can be a conductive fuse element that blows responsive to a threshold current density through the repair element. As an example, the fuse element can be designed for a $j^2t$ breakdown condition, where "j" is current density and "t" is time. The threshold current density can be a current density higher than the current density through the repair element during normal cell operation (e.g., during a program operation when the storage element of the cell is not stuck in a closed state). For instance, a breakdown condition (e.g., $j^2t$) of the fuse can be reached by applying a programming pulse to the cell that has a higher than normal magnitude for a shorter than normal duration or by applying a programming pulse to the cell that has a normal magnitude for a longer than normal duration. Embodiments are not limited to these examples.

In various embodiments, the threshold current density can be temperature dependent. As such, joule heating provided to the cell can assist in switching the repair element to the nonconductive state (e.g., a breakdown current density of the repair element can be reduced by increasing the temperature). The characteristics of the repair element (e.g., physical and electrical properties) can be tuned to provide a particular (e.g., desired) breakdown current density associated therewith. For instance, as described further in connection with FIG. 2B, a fuse element can have a tapered shape such that an increased current density is created through the portions of the fuse element having a narrower diameter.

Switching of the repair element to the nonconductive state can be permanent, such as when the repair element is a conductive fuse element that is blown responsive to the breakdown current density. In one or more embodiments, the repair element can be a filament, such as a conductive bridge filament, for example. A conductive bridge filament can include a solid electrolyte between a relatively inert metal electrode (e.g., tungsten) and an electrochemically active electrode (e.g., silver, copper, etc.). Similar to a conductive fuse element, a conductive bridge filament can be configured to burn out responsive to a threshold current density (e.g., such as when a short is created between a word line and bit line of the cell when a storage element of the cell is stuck in a closed state). However, unlike a fuse that may permanently be in a nonconductive state after being blown, a non conductive state of a conductive bridge filament may be reversible (e.g., under particular biasing conditions).

Figure 2A:
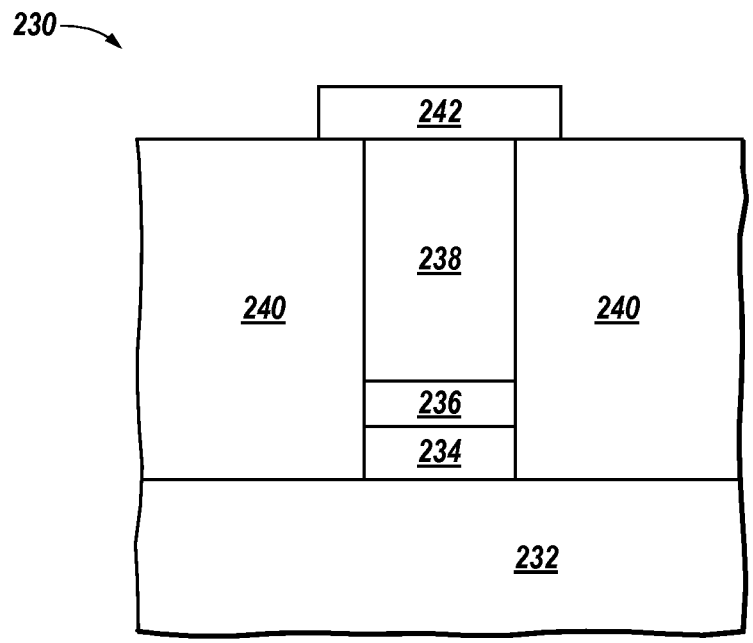
FIG. 2A is a cross-sectional view of a repairable memory cell in accordance with one or more embodiments of the present disclosure.

FIG. 2A is a cross-sectional view of a repairable memory cell 230 in accordance with one or more embodiments of the present disclosure. The cell 230 includes a storage element 234 positioned between a first electrode 232 and a second electrode 242. The cell 230 also includes a repair element 238 in series with, and positioned between, the storage element 234 and the second electrode 242. The first electrode 232 and the second electrode 242 can include a conductive material such as copper and/or tungsten, among other conductive electrode materials. As an example, the first electrode 232 can be a word line (e.g., word line 105-0, 105-1, ..., 105-N shown in FIG. 1, and the second electrode 242 can be a bit line (e.g., bit line 110-0, 110-1, ..., 110-M). Alternatively, the first electrode 232 and the second electrode 242 can be coupled to a respective word line and/or bit line associated with the memory cell 230. As such, the memory cell 230 can be a two-terminal structure at the intersection of a particular word line and bit line (e.g., in a cross point array), for instance.

As mentioned above, the storage element 234 of the memory cell 230 includes a programmable portion of the memory cell 230 (e.g., the portion programmable to a number of different data states). For instance, in resistive memory cells, the storage element 234 can include the portion of the memory cell 230 having a resistance that is programmable to particular levels corresponding to particular data states. The storage element 234 can include, for example, one or more resistance variable materials such as a transition metal oxide material or a perovskite including two or more metals (e.g., transition metals, alkaline earth metals, and/or rare earth metals). Embodiments are not limited to a particular resistance variable material or materials associated with the storage element 234. For instance, the storage element 234 can include a phase change chalcogenide formed of various doped or undoped materials, binary metal oxide materials, colossal magnetoresistive materials, and/or various polymer based resistive variable materials, among others materials. In one or more embodiments, the storage element 234 can include a magnetic tunnel junction (MTJ).

The repair element 238 is a portion of the memory cell 230 that changes from a conductive state to a nonconductive state responsive to a threshold current density therethrough. The repair element 238 can be, for example, a fuse element or a conductive bridge filament. As described above, the repair element 238 can be used to accommodate for a failed memory cell (e.g., a memory cell having a storage element 234 stuck in a closed state). The repair element 234 is configured to transition from a conductive state to a nonconductive state (e.g., in order to alleviate a short circuit between the first and second electrodes 232 and 242) if the storage element 234 of the cell 230 becomes stuck in a closed state, which can reduce or prevent the use of one or more redundant word lines and/or bit lines to accommodate for the failed cell.

In various embodiments, the repair element 238 can be a conductive fuse element that blows responsive to a threshold current density therethrough. The conductive fuse element 238 can include, for example, a metal conductor material such as tungsten, tungsten nitride, titanium, titanium nitride, and/or a doped silicon material, among other conductive materials. The particular material(s) and or physical configuration of the repair element 238 can depend on a desired threshold current density for the cell 230, among other factors. In one or more embodiments, the fuse element 238 is configured to permanently place the memory cell 230 in a nonconductive state (e.g., open state) responsive to the threshold current density therethrough (e.g., responsive to breakdown of the fuse element 238). In various embodiments, the repair element 238 can be a filament, such as a conductive bridging filament, for example.

Although not shown in FIG. 2A, the memory cell 230 can include a two-terminal select device (e.g., a diode) positioned between the first electrode 232 and the second electrode 242 and in series with the storage element 234 and the repair element 238, in one or more embodiments. In the example illustrated in FIG. 2A, the memory cell 230 includes a conductive contact 236 positioned at the interface of the storage element 234 and the repair element 238. The contact 236 can be a metal and/or other conductive material.

The memory cell 230 can be formed according to various processes including physical vapor deposition (PVD), chemical vapor deposition (CVD), and/or atomic layer deposition (ALD) processes and may incorporate various masking and etching techniques. As an example, a dielectric material 240 can be formed on the first electrode 232. The dielectric material 240 can act as a cell isolation dielectric 240 and can be various suitable dielectric materials, such as silicon dioxide and/or silicon nitride, for example.

A via can be formed in the dielectric material 240. A "stack" of materials can then be formed in the via, and the stack can include the storage element 234, the conductive contact 236, and the repair element 238, as shown in FIG. 2A. The second electrode 242 is formed on the repair element 238 (and on an upper surface of the dielectric material 240, in this example).

Figure 2B:
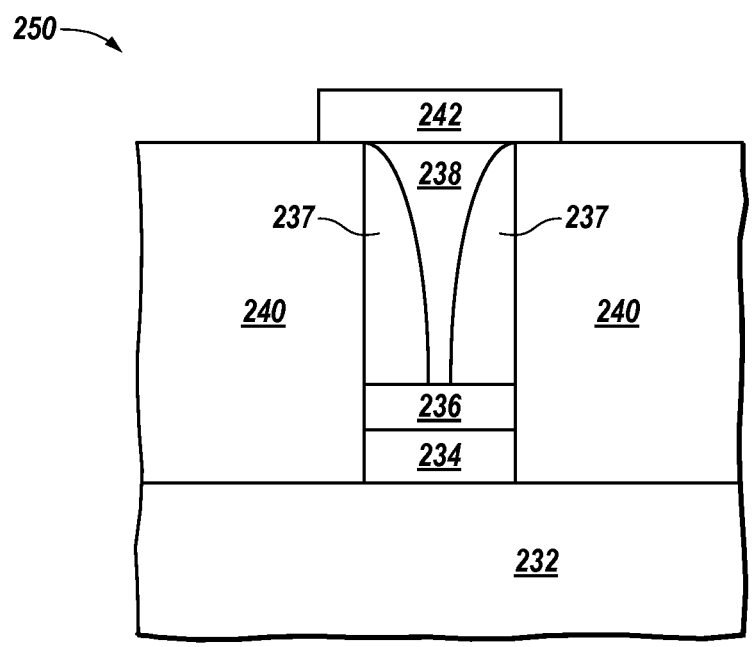
FIG. 2B is a cross-sectional view of a repairable memory cell in accordance with one or more embodiments of the present disclosure.

FIG. 2B is a cross-sectional view of a repairable memory cell 250 in accordance with one or more embodiments of the present disclosure. The cell 250 is similar to the cell 230 described in connection with FIG. 2A. As such, the memory cell 250 includes a storage element 234 positioned between a first electrode 232 and a second electrode 242. The cell 230 also includes a repair element 238 in series with and positioned between the storage element 234 and the second electrode 242.

In the example illustrated in FIG. 2B, the repair element 238 has a tapered shape. The repair element 238 can be formed, for example, by depositing a spacer material 237 in a via formed in the dielectric material 240. For instance, the spacer material 237 can be formed on a side wall of the dielectric material 240. The conductive repair element 238 can then be formed in a space formed by the spacer material 237. The spacer material 237 can be dielectric a material such as silicon dioxide and/or silicon nitride, for example. The dielectric spacer material 237 can be a material different than the dielectric material 240; however, embodiments are not so limited.

The repair element 238 is formed on the conductive contact 236, such that it is directly coupled to the second electrode 242 and the conductive contact 236. As illustrated in FIG. 2B, a portion of the spacer material 237 is in contact with the conductive contact 236. As described above, the particular conductive material 238 and/or the shape thereof can be tuned to provide a desired breakdown current density of the memory cell 250.

Figure 3:
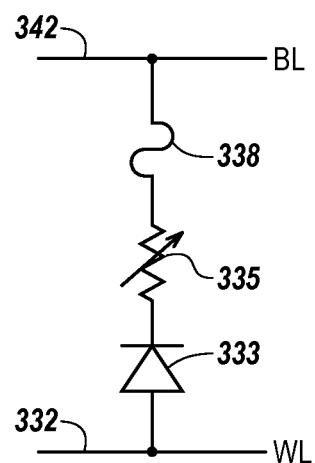
FIG. 3 is a schematic diagram of a repairable memory cell in accordance with one or more embodiments of the present disclosure.

FIG. 3 is a schematic diagram of a repairable memory cell in accordance with one or more embodiments of the present disclosure. In the example illustrated in FIG. 3, the memory cell is coupled to a word line 332 and bit line 342 in a two-terminal architecture such as described in FIG. 1. The memory cell includes a repair element 338 in series with a storage element 335 and a select device 333. In the example illustrated, the repair element is a fuse element 338, the storage element is a resistance variable memory element 234, and the select device is a diode 333.

In operation, the fuse element 338 is configured to permanently switch from a conductive to a nonconductive state (e.g., blow) in response to a breakdown current density, which can result when the storage element 335 of the cell is stuck in a closed state, for instance. The transition of the fuse to a nonconductive state (e.g., in order to alleviate a short circuit between the word line 332 and bit line 342) can reduce or prevent the use of one or more redundant word lines and/or bit lines to accommodate for the failed cell. Embodiments are not limited to the particular configuration illustrated in FIG. 3.

CONCLUSION

The present disclosure includes methods, devices, and systems associated with memory cell repair. A repairable memory cell in accordance with one or more embodiments of the present disclosure includes a storage element positioned between a first and a second electrode, and a repair element positioned between the storage element and at least one of the first electrode and the second electrode.

In the detailed description of the present disclosure, reference is made to the accompanying drawings that form a part hereof, and in which is shown by way of illustration how one or more embodiments of the present disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the extent of the present disclosure.

As used herein, the designators "N" and "M," particularly with respect to reference numerals in the drawings, indicate that a number of the particular feature so designated can be included with one or more embodiments of the present disclosure. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

As used herein, the term "and/or" includes any and all combinations of one or more of the associated listed items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A repairable memory cell, comprising:
   a storage element positioned between a first and a second electrode;
   a two-terminal select device positioned between the first and second electrode and coupled to the storage element; and
   a repair element positioned between the storage element and at least one of the first electrode and the second electrode.

2. The memory cell of claim 1, wherein the repair element includes a conductive material and is configured to become nonconductive responsive to a threshold current density through the repair element.

3. The memory cell of claim 1, wherein the repair element is configured to permanently place the memory cell in a particular state responsive to a threshold current density through the repair element.

4. The memory cell of claim 3, wherein the particular state is an open state.

5. The memory cell of claim 1, wherein repair element is a fuse element.

6. The memory cell of claim 1, wherein the first electrode is coupled to at least one of a word line and a bit line associated with the memory cell.

7. A repairable memory cell, comprising:
   a storage element positioned between a first and a second electrode;
   a conductive contact positioned between the second electrode and the storage element; and
   a repair element positioned between the conductive contact and the second electrode, wherein the repair element is a conductive material directly coupled to the conductive contact and to the second electrode, and wherein the conductive material is a metal.

8. A method of forming a repairable memory cell, comprising:
   forming a storage element between a first and a second electrode;
   forming a repair element between the storage element and at least one of the first and the second electrode;
   prior to forming the storage element and the repair element, forming a via in a dielectric material formed on the first electrode; and
   forming the storage material and the repair element in the via;
   wherein the repair element is configured to permanently switch a state of the storage element from a first state to a second state responsive to a threshold current density through the repair element.

9. The method of claim 8, wherein forming the repair element includes forming a fuse element.

10. The method of claim 9, wherein forming the fuse element includes:
    forming a dielectric spacer material on a sidewall of the dielectric material; and
    forming a conductive material in a space formed by the dielectric spacer material.

11. The method of claim 8, including forming a two terminal select device in the via.

12. The method of claim 8, including forming a conductive contact in the via, the conductive contact positioned between the storage element and the repair element.

13. The method of claim 8, wherein the repair element is configured to permanently switch the state of the storage element from the first state to the second state by switching from a conductive state to a nonconductive state.

14. A memory array, comprising:
    a first number of conductive lines;
    a second number of conductive lines substantially perpendicular to the first number of conductive lines;

a storage element positioned at each of a number of intersections of the first number and the second number of conductive lines; and a repair element positioned between the storage element and at least one of the first number and the second number of conductive lines at one or more of the number of intersections.

15. The memory array of claim 14, wherein the repair element is a fuse element configured to breakdown responsive to a particular current density therethrough that is greater than a current density associated with programming the storage element.

16. The memory array of claim 14, wherein the array includes a select device coupled in series with the storage element and the repair element.

17. The memory array of claim 14, wherein the memory array is a cross point array of memory cells in a two-terminal architecture.

18. The memory array of claim 14, wherein each of the number of intersections includes a repair element positioned between the storage element and at least one of the first number and the second number of conductive lines.

19. The memory array of claim 14, wherein the storage element includes a magnetic tunnel junction (MTJ).

20. The memory array of claim 14, wherein the storage element includes a phase change material.

21. A repairable memory cell, comprising:
a storage element positioned between a first and a second electrode; and
a repair element positioned between the storage element and at least one of the first electrode and the second electrode, wherein the repair element includes a conductive material and is configured to become nonconductive responsive to a threshold current density through the repair element, and wherein the conductive material of the repair element has a tapered shape.

22. A repairable memory cell, comprising:
a storage element positioned between a first and a second electrode;
a conductive contact positioned between the second electrode and the storage element; and
a repair element positioned between the conductive contact and the second electrode, wherein the repair element is a conductive material directly coupled to the conductive contact and to the second electrode, and wherein a side wall of the repair element is in contact with a first dielectric material.

23. The memory cell of claim 22, wherein a side wall of the first dielectric material is in contact with a second dielectric material that is different than the first dielectric material.

24. The memory cell of claim 22, wherein at least a portion of the first dielectric material is in contact with the conductive contact.

25. A repairable memory cell, comprising:
a storage element positioned between a first and a second electrode;
a conductive contact positioned between the second electrode and the storage element;
a repair element positioned between the conductive contact and the second electrode; and
a dielectric material formed on the first electrode, wherein the storage element, the conductive contact, and the repair element are formed in a via formed in the dielectric material.

26. The memory cell of claim 25, including a diode formed in the via and coupled to the storage element.

* * * * *